(12) United States Patent
Tseng et al.

(10) Patent No.: US 9,608,062 B1
(45) Date of Patent: Mar. 28, 2017

(54) SEMICONDUCTOR STRUCTURE AND METHOD OF FORMING THE SAME

(71) Applicant: UNITED MICROELECTRONICS CORP., Hsin-Chu (TW)

(72) Inventors: I-Ming Tseng, Kaohsiung (TW); Wen-An Liang, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/250,924

(22) Filed: Aug. 30, 2016

(30) Foreign Application Priority Data

Aug. 3, 2016 (TW) .............................. 105124563 A (51) Int. Cl.
| | |
|---|---|
| *H01L 27/088* | (2006.01) |
| *H01L 29/06* | (2006.01) |
| *H01L 29/78* | (2006.01) |
| *H01L 29/08* | (2006.01) |
| *H01L 29/66* | (2006.01) |
| *H01L 21/762* | (2006.01) |

(52) U.S. Cl.
CPC .... *H01L 29/0653* (2013.01); *H01L 21/76224* (2013.01); *H01L 29/0847* (2013.01); *H01L 29/66636* (2013.01); *H01L 29/66795* (2013.01); *H01L 29/7851* (2013.01)

(58) Field of Classification Search
CPC ........... H01L 29/0653; H01L 29/66636; H01L 29/7851; H01L 21/76224; H01L 29/66795; H01L 29/0847
See application file for complete search history.

(56) References Cited

U.S. PATENT DOCUMENTS

| 8,502,316 B2 | 8/2013 | Fung |
| 2013/0187237 A1 | 7/2013 | Yu |

OTHER PUBLICATIONS

Lin, Title of Invention: FinFET Structure Device, U.S. Appl. No. 15/064,618, filed Mar. 9, 2016.
Tseng, Title of Invention: Semiconductor Device and Method for Fabricating the Same, U.S. Appl. No. 14/844,004, filed Sep. 3, 2015.

*Primary Examiner* — Stephen W Smoot
*Assistant Examiner* — Vicki B Booker
(74) *Attorney, Agent, or Firm* — Winston Hsu; Scott Margo (57) ABSTRACT

The present invention provides a semiconductor structure including a fin structure formed on a substrate, and an isolation structure formed in the fin structure. The isolation structure includes a trench, and a first dielectric layer disposed in the trench wherein the first dielectric layer includes a body portion in the bottom, a protruding portion in the top with a top surface, and a shoulder portion connecting the body portion and the protruding portion. The protruding portion has a smaller width than the body portion. The semiconductor structure further includes a second dielectric layer covering a top corner of the trench and sandwiched between the protruding portion, the shoulder portion of the first dielectric layer and the upper sidewall of the trench.

20 Claims, 11 Drawing Sheets

SEMICONDUCTOR STRUCTURE AND METHOD OF FORMING THE SAME

BACKGROUND OF THE INVENTION

1. Field of the Invention

The present invention generally relates to semiconductor structure and method of forming the same, and more particularly, to an isolation structure of a semiconductor structure and the method of forming the same.

2. Description of the Prior Art

In advanced semiconductor technology, fin field effect transistors (Fin FET) have taken the place of traditional planar transistors and have become the mainstream of development. Generally, at the beginning of forming a fin FET, trenches are formed in a semiconductor substrate by patterning processes, such as a photolithograph-etching process (PEP), to transfer the pattern of a design layout to the semiconductor substrate wherein areas of fin structures are defined in the semiconductor substrate by the trenches. Insulating materials are then formed and filled in to the trenches to form an isolation structure between the fin structures. Afterward, gate structures crossing over the fin structures may be formed, and the overlap regions of the fin structures and the gate structures are the channel regions of the fin FETs. To improve device performance, a strained silicon structure may be formed at each side of the gate structures to be the source/drain region.

Figure 1:
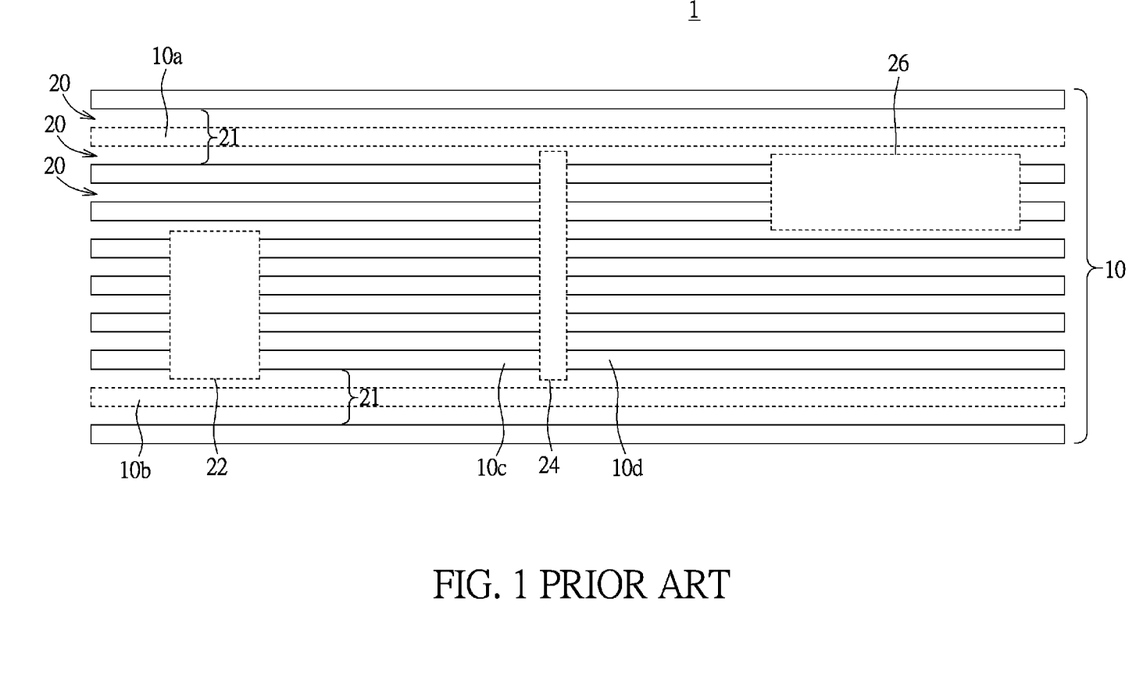
FIG. 1 is a schematic top view, illustrating the method of forming a plurality of fin sections or fin segments on semiconductor substrates by multiple-patterning technology.

With the development of semiconductor technology, the sizes of semiconductor devices continue to shrink for better performance, higher degree of integration and better economic benefit. To fabricate the semiconductor devices comprising finer fin structures and small pitches, multiple-patterning technologies have been proposed and widely adopted for better resolution and avoiding the deformation result from etching loading effect, such as photolithography-etch-photolithography-etch (2P2E) process, photolithography-photolithography-etch (2P1E) process or spacer self-aligned double-patterning (SADP) process. For example, as shown in FIG. 1, a first patterning process is carried out to define an array of fin structures 10 on the substrate 1, wherein a plurality of fin structures extending along the same direction are arranged in close proximity to each other and separated by the trenches 20 formed therebetween. Afterward, a second patterning process is carried out, for example, to remove the dummy fin structures 10a and 10b to form wider trenches 21 thereby. Subsequently, a third patterning process may be performed, for example, to form the trenches 22, 24 and 26 to divide the fin structures into fin segments (or sections). After the multiple-patterning processes aforesaid, the trenches 20, 21, 22, 24, 26 may be filled with an insulating material, and a planarization process may then be performed, to remove the excess insulating material and form the isolation structures. The fin segments formed by the multiple-patterning technology may be more uniform in dimensions and may have tapered cross-sectional profiles. Conventional line end shorting or narrowing problem caused by optical proximity effect (OPE) is prevented. The fin segments formed on the substrate by the multiple-patterning technology may have similar cross-sectional profiles regardless of variations in patterning densities and pitches.

However, with the trend of device shrinking, the widths of the trenches may also be scaled down. Regarding the trench used to segment fin structures, such as the trench 24, smaller width may make the adjacent distal ends of two fin segments, such as 10c and 10d, be so close that the risk of epitaxial bridging among them is increased. Similarly, for the purpose of device shrinking, the source/drain contact plugs may be disposed very close to the distal ends of fin segments. Unfortunately, facet defects are found more often in the epitaxial structures near the distal ends of the fin segment and therefore result in poor landing of the source/drain contact plugs.

Therefore, there is still a need in the field to provide an improved isolation structure used in dividing the fin structures into a plurality of fin segments. The isolation structure may preferably have a smaller width to achieve a smaller layout area, and furthermore, may be able to prevent the epitaxial bridging issue between the adjacent distal ends of the closely spaced fin segments and improve the yield of the source/drain contact plugs disposed at the distal ends.

SUMMARY OF THE INVENTION

One objective of the present invention is to provide a semiconductor structure, and more particularly, a semiconductor structure including an isolation structure formed in a fin structure.

According to one embodiment, a semiconductor structure is provided, including a fin structure disposed on a substrate, and an isolation structure formed in the fin structure. The isolation structure includes a trench and a first dielectric layer disposed in the trench. The first dielectric layer includes a body portion in the bottom, a protruding portion in the top with a top surface, and a shoulder portion connecting the body portion and the protruding portion, wherein the protruding portion has a smaller width than the body portion. A second dielectric layer is formed, covering a top corner of the trench and sandwiched in between the protruding portion and the shoulder portion of the first dielectric layer and an upper sidewall of the trench.

According to another embodiment, a seam is comprised in the middle of the first dielectric layer and extending along the depth direction of the trench.

According to another embodiment, the top surface of the protruding portion is lower than the fin structure by 10 to 100 angstroms.

According to still another embodiment, the semiconductor structure further comprises a gate body, disposed on the fin structure and completely covering the trench and filling into an upper portion of the trench, wherein the second dielectric layer is sandwiched in between the gate body, the protruding portion and the shoulder portion of the first dielectric layer and the upper sidewall of the trench.

Another objective of the present invention is to provide a method of forming a semiconductor structure, and more particularly, a method of forming an isolation structure in a fin structure.

According to one embodiment, the method of forming a semiconductor structure includes the following steps. First, a fin structure is formed on a substrate. Subsequently, a trench is formed in the fin structure. A first dielectric layer is then formed filling the trench, and comprising a body portion in the bottom, a protruding portion in the top, and a shoulder portion connecting the body portion and the protruding portion. After that, a second dielectric layer may be formed covering a top corner of the trench and sandwiched between the protruding portion and the shoulder portion of the trench an upper sidewall of the trench.

According to another embodiment, the first dielectric layer is formed by atomic layer deposition (ALD) process.

According to another embodiment, the first dielectric layer comprises silicon nitride.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 2 to FIG. 11 are schematic diagrams, illustrating the method of forming a semiconductor structure according to one embodiment of the present invention, wherein:

FIG. 2 is a schematic diagram of the semiconductor structure after trenches and fin structures are formed on a substrate, wherein FIG. 2(a) is a top view of the semiconductor structure, FIG. 2(b) is a cross-sectional view taken along line A-A' in FIG. 2(a), and FIG. 2(c) is a cross-sectional view taken along line B-B' in FIG. 2(a);

FIG. 6(b) is a cross-sectional view taken along line A-A' in FIG. 6(a);

DETAILED DESCRIPTION

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention.

The drawings showing embodiments of the apparatus are not to scale and some dimensions are exaggerated in the figures for clarity of presentation. Also, where multiple embodiments are disclosed and described as having some features in common, like or similar features will usually be described with like reference numerals for ease of illustration and description thereof.

Figure 2:
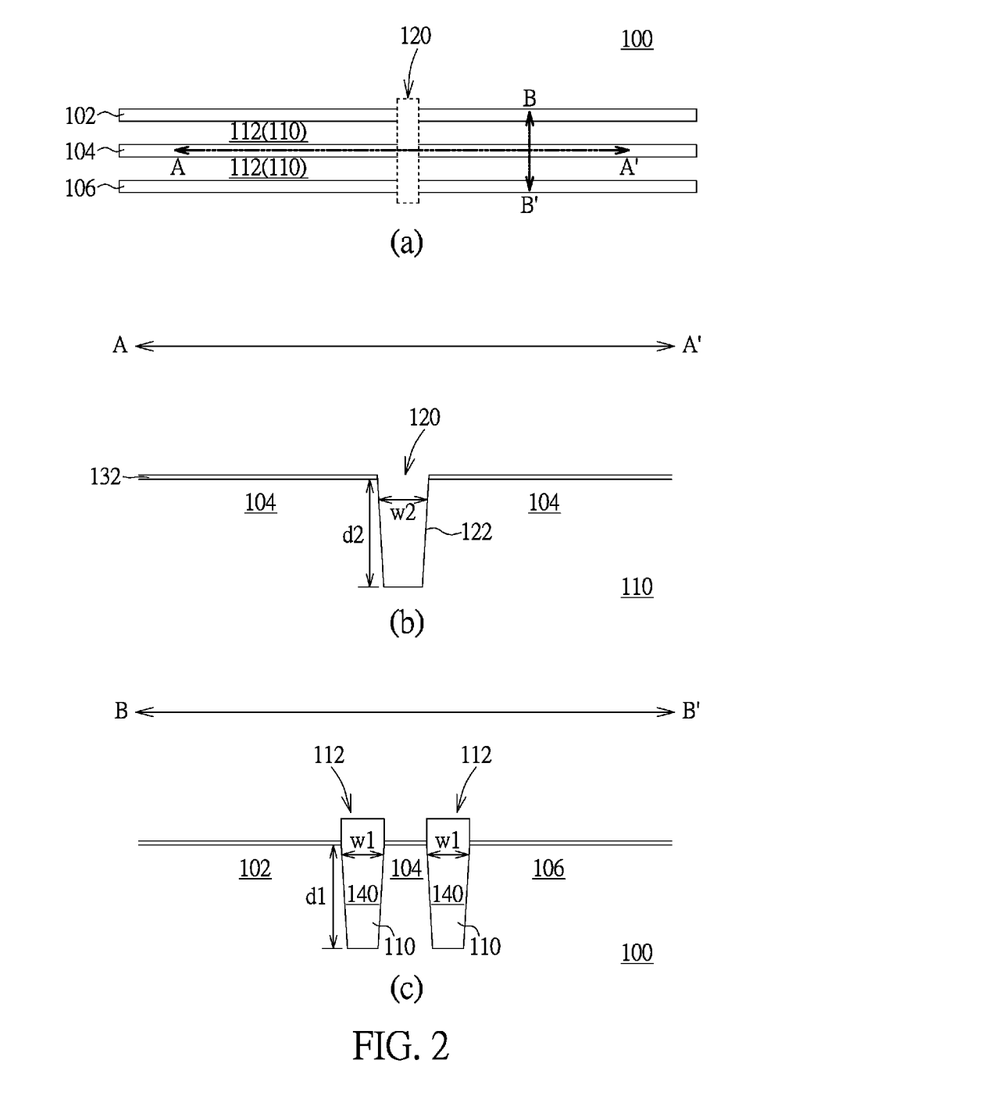

Please refer to FIG. 2, which is a schematic diagram of the semiconductor structure after the trenches and fin structures are formed on the substrate, wherein FIG. 2(a) is a top view of the semiconductor structure, FIG. 2(b) is a cross-sectional view taken along line A-A' in FIG. 2(a), and FIG. 2 (c) is a cross-sectional view taken along line B-B' in FIG. 2(a). Although line A-A' shown in FIG. 2 (a) is extending along the fin structure 104, it should be understood that the trench 120 may be formed extending to fin structure 102 and 106 neighboring the fin structure 104, and therefore the following description and diagrams as shown in FIG. 4 to FIG. 11 are also applicable to illustrate the cross-sectional structures of the fin structure 102 and 106 along their longitudinal directions.

As shown in FIG. 2(a), a substrate 100 is provided. The substrate 100 may comprise a silicon substrate, a silicon-containing substrate or a silicon-on-insulator (SOI) substrate, but not limited thereto. A plurality of fin structures such as fin structures 102, 104 and 106, inter-fin isolation structures 112 and a trench 120 are formed in the substrate 100. As shown in FIG. 2(a) and FIG. 2(c), the inter-fin isolation structure 112 may comprise an inter-fin trench 110 and a dielectric layer 140, such as silicon oxide. The fin structures 102, 104 and 106 may be parallel and are separated from each other by the inter-fin isolation structures 112 by encompassed by inter-fin isolation structures 112 along their longitudinal direction. The trench 120 may be formed in the substrate 100 and extends in a direction orthogonal to the fin structures 102, 104 and 106. More particularly, as shown in FIG. 2 (a) and FIG. 2 (b), the trench 120 may cut into the fin structures 102, 104 and 106 and the inter-fin isolation structures 112, to divide each of the fin structure 102, 104 and 106 into at least two fin segments.

According to the embodiment, the method to form the fin structures 102, 104 and 106 may comprise the following process. First, a pad oxide 132 and a hard mask layer (not shown) comprising, for example, a silicon nitride layer and/or silicon oxide layer may be formed successively on the substrate 100. After that, a patterning process, such as a photolithography-etching process (PEP), may be carried out to etch the substrate 110 through the hard mask layer, to form the inter-fin trenches 110 in the substrate 100 and define the fin structures 102, 104 and 106. According to an embodiment, multiple-patterning technology, such as pitch scaling technology or sidewall image transfer (SIT) technology, may be utilized to form the fin structures arranged in close proximity. To simplify the disclosure, the patterning process to form the fin structures 102, 104 and 106 will not be illustrated further in detail herein.

After the fin structures 102, 104 and 106 have been formed, optionally, a liner, such as an oxide liner or a nitride liner, may be formed on the surface of the inter-fin trenches 110. Subsequently, a dielectric layer 140 covering the fin structures 102, 104 and 106 may be formed and fill the inter-fin trenches 110. The dielectric layer 140 may be formed by, for example, flowable chemical vapor deposition (FCVD) process, and an annealing process 142 may then be carried out to solidify and densify the dielectric layer 140. After that, a planarization process, such as a chemical mechanical polishing (CMP), may be performed to remove the excess dielectric layer 140 outside the inter-fin trenches 110. A substantially planar top surface and the inter-fin isolation structure 112 are obtained thereby.

According to the embodiment, after forming the inter-fin isolation structure 112, the hard mask layer (not shown) may be removed. The pad oxide 132 may remain on the substrate 100 to serve as a buffer layer in the following process. Subsequently, a fin cut process, such as single diffusion break (SDB) process, may be carried out to form the trench 120. The trench 120 may cut into the fin structures 102, 104 and 106 and divide each of the fin structures 102, 104 and 106 into at least two fin segments respectively. According to an embodiment, the depth d2 of the trench 120 may be substantially equal to the depth d1 of the inter-fin trench 110. According to another embodiment, the width w2 of the trench 120 may be substantially smaller than or equal to the width w1 of the inter-fin trench 110.

Figure 3:
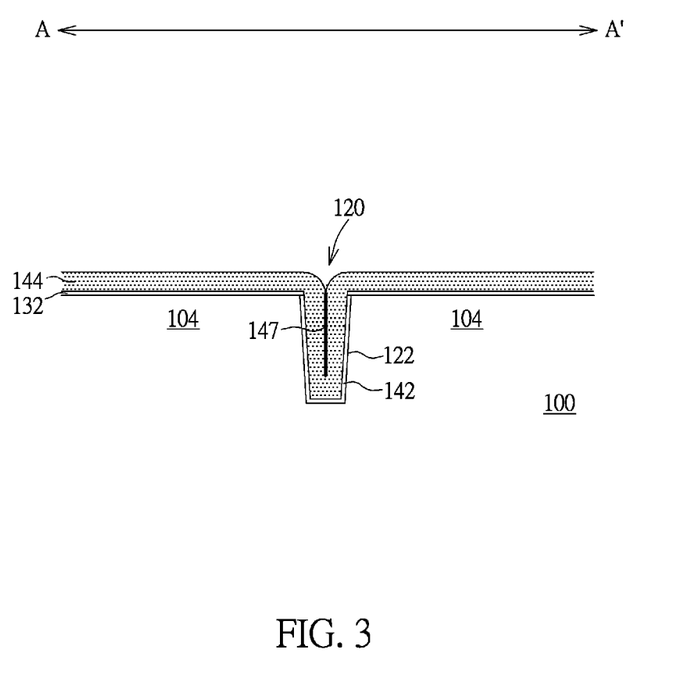
FIG. 3 is a cross-sectional view of the semiconductor structure after a first dielectric material layer is formed.
Figure 4:
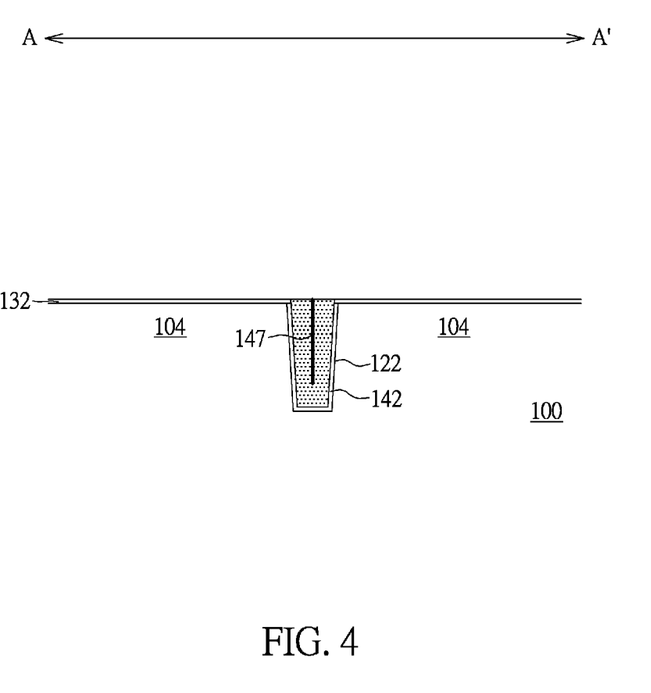
FIG. 4 is a cross-sectional view of the semiconductor structure after a portion of the first dielectric material layer is removed and a well region is formed in the substrate.
Figure 5:
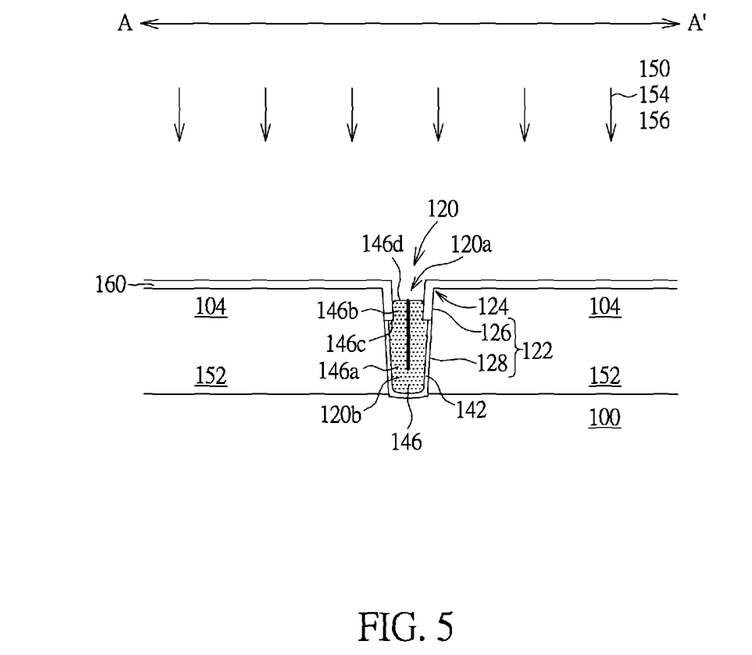
FIG. 5 is a cross-sectional view of the semiconductor structure wherein a first dielectric layer is formed filling a lower portion of the trench and a gate dielectric layer is formed conformally covering the first dielectric layer and the fin structure.

FIG. 3 to FIG. 5 are also cross-sectional diagrams taken along line A-A' in FIG. 2(a), showing the cross-sectional structures of the fin structure 104 along its longitudinal direction during the following process.

Please refer to FIG. 3. A thermal oxidation process may be carried out to form a liner 142 on the surface of the trench 120. After that, a first dielectric material layer 144, such as silicon oxide or silicon nitride, may be formed conformally covering the fin structure 104 and filling the trench 120. According to a preferred embodiment, the first dielectric material layer 144 may be formed by atomic layer deposition (ALD) process, and may have superior gap filling capability for a high aspect-ratio trench. According to the embodiment, by stacking layers of the atomic layer of the first dielectric material layer 144 during the ALD process, the first dielectric material layer 144 is growing thicker uniformly from the bottom and the sidewall of the trench 120 toward the center of the trench 120 until the trench 120 is completely filled or partially filled with a seam or space having a pre-determined width formed therein. Accordingly, as shown in FIG. 3, a seam 147 or a space may be formed in the middle of the first dielectric material layer 144 in the trench 120 and extend along the depth direction of the trench 120, wherein the distances from each sidewall of the trench 120 to the seam 147 are the same. According to the embodiment, the width of the seam 147 or the space may be equal to or larger than 0 angstroms.

Please refer to FIG. 4. Subsequently, an etching back process may be performed to remove the excess first dielectric material layer 144 outside the trench 120, and the first dielectric material layer 144 remaining in the trench 120 becomes the first dielectric layer 146. According to a preferred embodiment, the first dielectric material layer 144 comprises silicon nitride, and therefore the pad oxide 132 underneath may be used as an etching stop layer for an accurate control of the etching end-point. Therefore, an undesired large step-height between the first dielectric layer 146 and the fin structure 104 resulting from being etched too much, or residues of the first dielectric material layer 144 on the fin structure 104 resulting from being etched insufficiently may be avoided.

Please refer to FIG. 5. After the etching back process, anion implantation process 150 may be performed to implant impurities with certain species and dosages into the fin structure 104 to form the well region 152, and an anneal process 154 may be performed after forming the well region 152. Subsequently, after removing the pad oxide 132 and a portion of the dielectric layer 140 of the inter-fin isolation structure 112 by performing an etching process to expose the upper surface of the fin structure 104 and an upper sidewall of the inter-fin trench 110 (not shown), a thermal oxidation process 156, such as in situ steam generation (ISSG) process, may be carried out to form a gate dielectric layer 160 on the exposed surface of the fin structure 104. As shown in FIG. 5, the depth d2 of the trench 120 may be larger than or equal to the depth of the well region 152. According to a preferred embodiment, the first dielectric layer 146 may comprise silicon nitride and would not be etched during the removal of the pad oxide 132, and the undesired large step-height between the first dielectric layer 146 and the fin structure 104 may be avoided.

It is noteworthy that the annealing process 154 and the thermal oxidation process 156 may cause the first dielectric layer 146 to shrink. Accordingly, as shown in FIG. 5, after the annealing process 154 and the thermal oxidation process 156, the first dielectric layer 146 may shrink and have a unique shape, such as a bottle shape, and may have a top surface lower than the fin structure 104. More particularly, the bottle-shaped first dielectric layer 146 may have a body portion 146a in the bottom and filling a lower portion 120b of the trench 120, a protruding portion 146b in the top, and a shoulder portion 146c connecting the body portion 146a and the protruding portion 146b, wherein the protruding portion 146b has a smaller width than the body portion 146a. As shown in FIG. 5, an upper portion 120a of the trench 120 is not filled by the first dielectric layer 146.

It is also noteworthy that before removing the pad oxide 132, the annealing process 154 performed after forming the well region 152 may have caused the first dielectric layer 146 to shrink partially, and therefore exposing a top corner 124 of the trench 120 and forming a space between the first dielectric layer 146 and the liner 142 on the upper sidewall 126 of the trench 120. Consequently, during the process of removing the pad oxide 132, the liner 142 on the upper sidewall 126 of the trench 120 may also be removed from the space, and the gate dielectric layer 160 may also be formed along the exposed top corner 124 and the upper sidewall 126 of the trench 120 during the following thermal oxidation process 156. As shown in FIG. 5, the gate dielectric layer 160 may cover the top corner 124 and the upper sidewall 126 of the trench 120, and be sandwiched in between the protruding portion 146b and the upper sidewall 126 of the trench 120, extending downward to the shoulder portion 146c of the first dielectric layer 146. The liner 142 is only disposed between the body portion 146a and the lower sidewall 128 of the lower portion 120b and is not in direct contact with the protruding portion 146b. A distal end of the liner 142 is flush with the shoulder portion 126c and is in direct contact with the gate dielectric layer 160. According to an embodiment, the thickness of the gate dielectric layer 160 may be thicker than or equal to the thickness of the liner 142. According to an embodiment, the protruding portion 146b may have a top surface 146d lower than the upper surface of the fin structure 104 by about 10 to 100 angstroms. Although the upper sidewall 126 and the lower sidewall 128 are covered by the gate dielectric layer 160 and the liner 142 respectively, they collectively form a substantially straight sidewall 122 of the trench 120.

Figure 6:
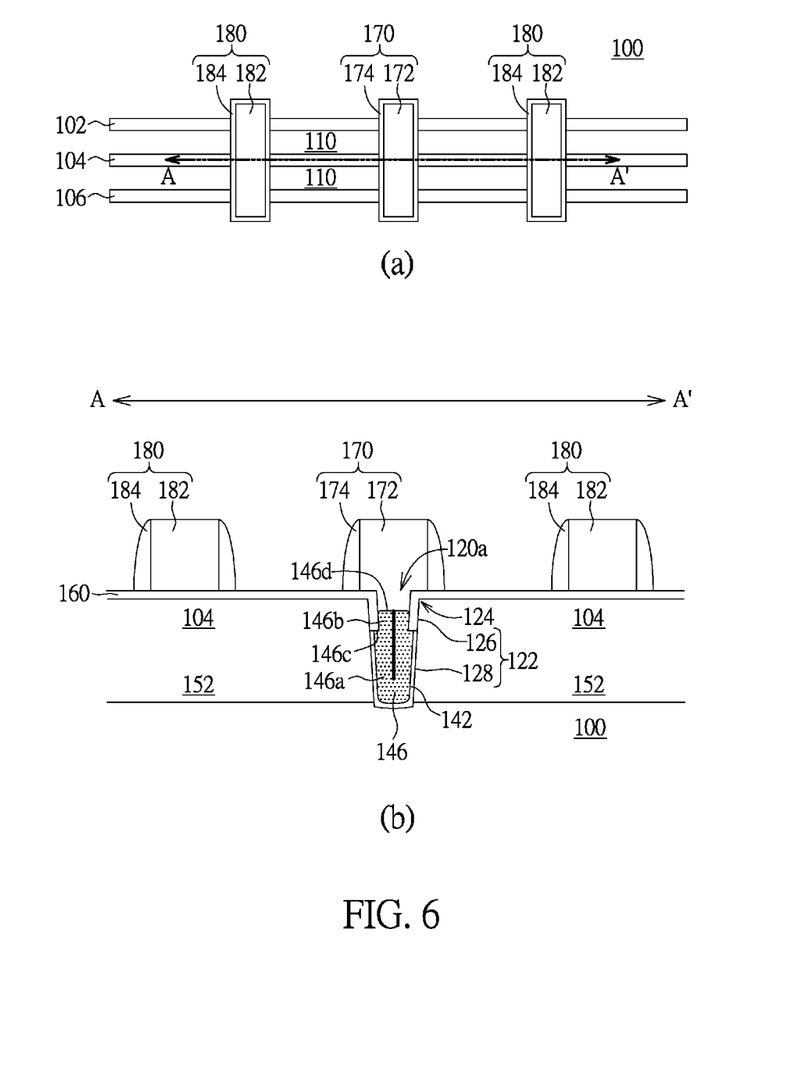
FIG. 6 is a schematic diagram of the semiconductor structure after gate structures are formed on the substrate, wherein FIG. 6 (a) is a top view of the semiconductor structure.

Please refer to FIG. 6, which is a schematic diagram of the semiconductor structure after gate structures are formed on the substrate, wherein FIG. 6(a) is a top view of the semiconductor structure, and FIG. 6(b) is a cross-sectional view taken along line A-A' in FIG. 6(a).

Following, the gate structures 170 and 180 are formed across the fin structures 102, 104 and 106 orthogonally and extending along a direction perpendicular to the longitudinal directions of the fin structures 102, 104 and 106. The gate structure 170 may comprise a gate body 172 and a spacer 174, and is formed atop the trench 120 and completely covers the trench 120. The gate structure 180 may comprise a gate body 182 and a spacer 184, and is formed on each of the fin segments of the fin structure 104 separated by the trench 120. According to one embodiment, the process of forming the gate structures 170 and 180 may include forming a gate body material layer, such as poly silicon or amorphous silicon, blanketly covering the fin structure 102, 104 and 106. A planarization process and a following pattering process may be performed to form the gate bodies 172 182. After that, the spacers 174 184, such as oxide spacer or nitride spacer, are formed on the two opposite sidewalls of the gate bodies 172 and 182 respectively. As shown in FIG. 6(b), the gate body 172 is aligned with and completely covers the trench 120 and fills into the upper portion 120a of the trench 120. In other words, the adjacent distal ends of the fin segments separated by the trench 120 formed in the structure 104 are completely covered by the gate body 172 and therefore not exposed. The gate dielectric layer 160 is disposed (or sandwiched in) between the gate body 172, the protruding portion 146b and the shoulder portion 146c of the first dielectric layer 146 and the upper sidewall 126 of the trench 120.

FIG. 7 to FIG. 11 are also cross-sectional diagrams taken along line A-A' in FIG. 6(a), showing the cross-sectional structures of the fin structure 104 along its longitudinal direction during the following process.

Figure 7:
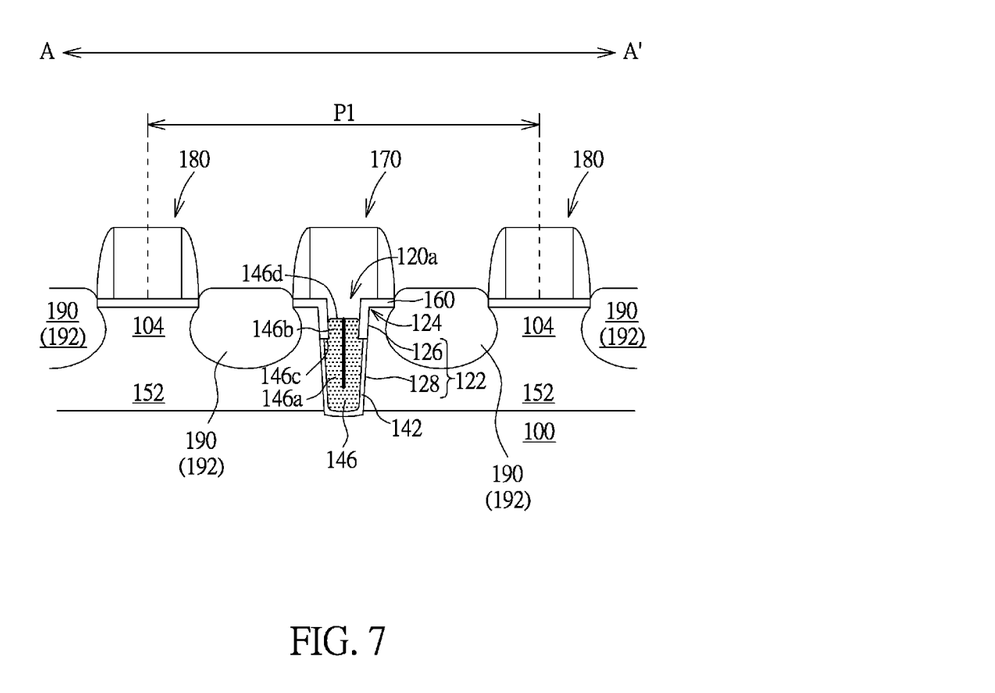
FIG. 7 is a cross-sectional view of the semiconductor structure after source/drain regions are formed.

Please refer to FIG. 7. After forming the gate structures 170 and 180, subsequently, an epitaxial layer 190 is formed in the fin structure 104 at each side of the gate structures 170 and 180. The epitaxial layer 190 may form the source/drain region 192 of the device in the later process. The method of forming the epitaxial layers 190 may include, first, forming a recess in the fin structure 104 at each side of the gate structures 170 and 180 in a manner of self-aligning with the gate structures 170 and 180. After that, an epitaxial growing process may be performed to form the epitaxial layer 190 in the recess. The epitaxial layers 190 may be formed comprising impurities having particular species and pre-determined concentrations suitable to form the source/drain region 192 by, for example, in-situ doping processes, or post-epitaxial implant processes. According to an embodiment, the source/drain region 192 is adjacent to the upper sidewall 126 of the trench 120, but not in direct contact with the trench 120. The source/drain region 192 may have a bottom surface lower than the shoulder portion 146c of the first dielectric layer 146. It is noteworthy that, as shown in FIG. 7, by forming the gate dielectric layer 160 and the gate body 172 completely covering the trench 120 and filling the upper portion 120a of the trench 120 before the epitaxial growing process, the epitaxial bridging between the epitaxial layers 190 formed in the adjacent distal ends of the fin segments at two sides of the trench 120 may be prevented. Furthermore, by self-aligning with the gate structure 170, the recess formed in the fin segment of the fin structure 104 at each side of the trench 120 is spaced from the sidewall 122 of the trench 120 by a certain distance. In other words, the sidewall 122 of the trench 120 would not be exposed from the recess during the epitaxial growing process and therefore the facet defect may be avoided. Furthermore, by forming the gate structure 170 completely covering the trench 120 and the two adjacent distal ends of the fin segments of the fin structure 104 at the same time, a smaller pitch P1 between the gate structures 180 disposed respectively on each of the fin segments spaced apart by the trench 120 may be obtained, and therefore a smaller layout area may be achieved.

Figure 8:
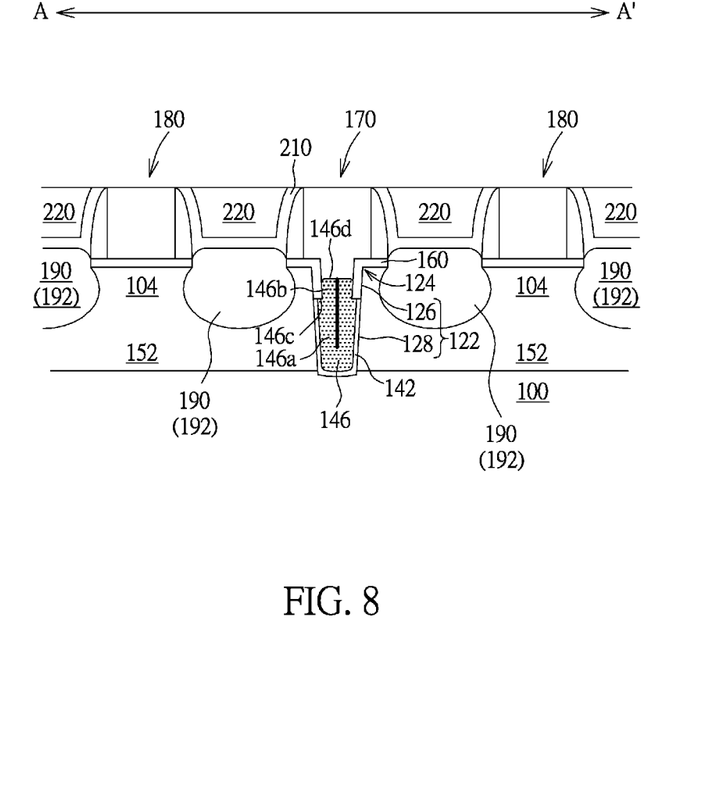
FIG. 8 is a cross-sectional view of the semiconductor structure after a contact etching stop layer (CESL) and an interlayer dielectric (ILD) layer are formed.

Please refer to FIG. 8. Afterward, a contact etching stop layer (CESL) 210 and an interlayer dielectric layer 220 may be formed blanketly covering the fin structure 104, the source/drain regions 192 and the gate structures 170 and 180. A planarization process may be performed to remove a portion of the contact etching stop layer 210 and a portion of the interlayer dielectric layer 220 to expose the top surface of the gate structures 170 and 180.

Figure 9:
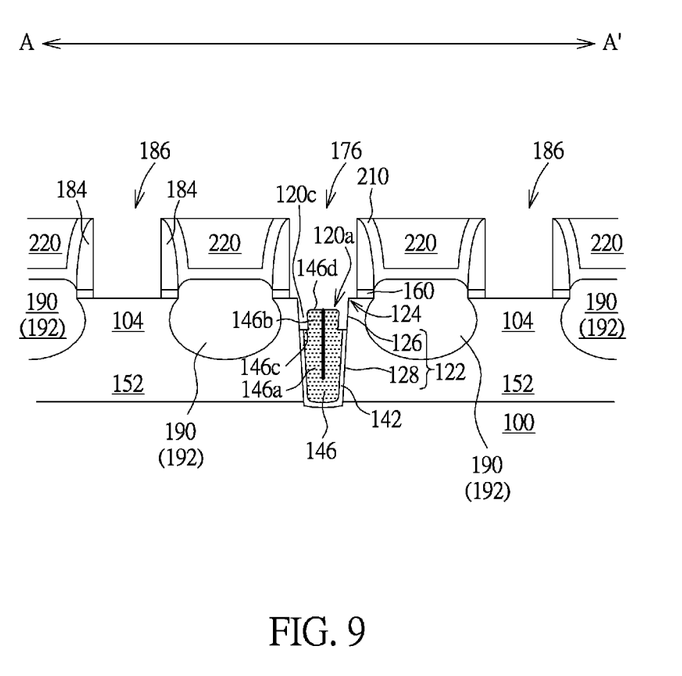
FIG. 9 is a cross-sectional view of the semiconductor structure after gate trenches are formed.
Figure 10:
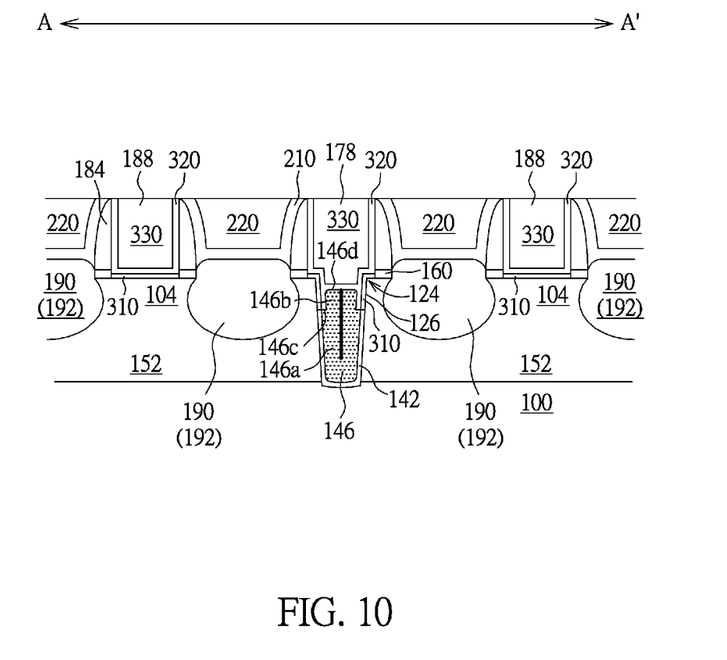
FIG. 10 is a cross-sectional view of the semiconductor structure after an interfacial layer, a high-k dielectric layer and a metal gate body are formed.

FIG. 9 and FIG. 10 are cross-sectional diagrams, illustrating performing the replacement metal gate (RMG) process to form the metal gate structures.

Please refer to FIG. 9. Subsequently, the gate bodies 172 and 182 are removed from the exposed top surface of the gate structures 170 and 180, to form the gate trenches 176 and 186 respectively, and a portion of the gate dielectric layer 160 may be exposed from the gate trenches 176 and 186. According to the embodiment, after removing the exposed gate dielectric layer 160, the upper surface of the fin structure 104 is exposed and a space 120c is formed between the protruding portion 146b, the shoulder portion 146c of the first dielectric layer 146 and the upper sidewall 126 of the trench 120.

Please refer to FIG. 10. Subsequently, a thermal oxidation process may be performed to form an interfacial layer (IL) 310, such as silicon oxide, conformally covering the fin structure 104 and the top corner 124, the upper sidewall 126 of the trench 120 through the space 120. After that, a high-k dielectric layer 320 may be formed conformally covering the interfacial layer 310, the top surface 146d of the protruding portion 146b and the sidewalls of the gate trenches 176 and 186. After that, the metal gate bodies 330 may be formed, filling the gate trenches 176 and 186 and the upper portion 120a of the trench 120, thereby forming the metal gate structures 178 and 188 The metal gate body 330 filling the gate trench 176 and the upper portion 120a of the trench 120 may have a bottom surface lower than the upper surface of the fin structure 104 by about 50 to 100 angstroms. According to one embodiment, the metal gate structure 178 may be a dummy gate which is not electrically connected with other circuits, but not limited thereto. In other embodiments, the metal gate structure 178 may connect to the gate structure of other fin FETs, or may be a local inter-connecting structure which is electrically connected with an outer circuit. The metal gate structure 178, and the first dielectric layer 146, the interfacial layer 310 and the high-k dielectric layer 320 disposed in the trench 120 in the fin structure 104 collectively form a single diffusion break (SDB) isolation structure.

As shown in FIG. 10, the interfacial layer 310 and the high-k dielectric layer 320 may be formed extending along the space 120c and collectively filling the space 120c. The interfacial layer 310 and the high-k dielectric layer 320 may cover the top corner 124 and the upper sidewall 126 of the trench 120, and are sandwiched in between the upper sidewall 126 of the trench 120 and the protruding portion 146b and the shoulder portion 146c of the first dielectric layer 146. According to the embodiment, as shown in FIG. 10, the high-k dielectric layer 320 may further cover the top surface 146d of the protruding portion 146b, and have a H-shape profile accordingly. The high-k dielectric layer 320 also extends upwardly to be between the gate body 330 and the spacer 174.

Figure 11:
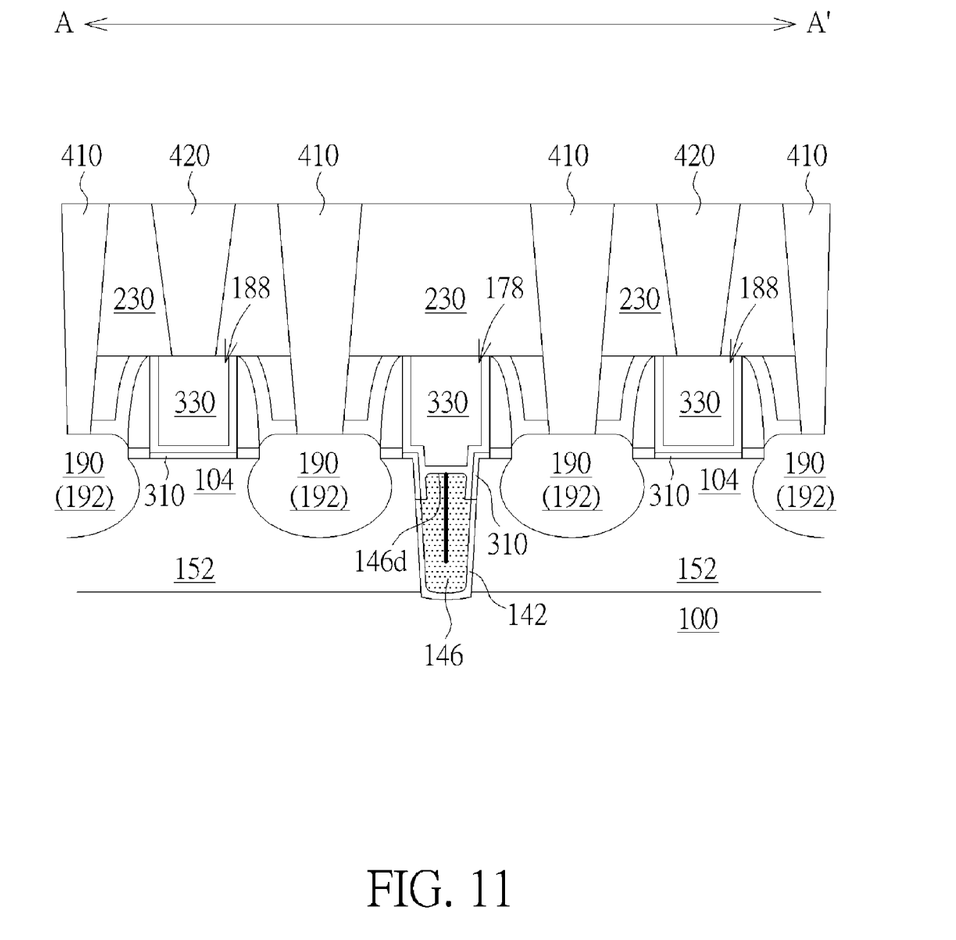
FIG. 11 is a cross-sectional view of the semiconductor structure after contact plugs are formed.

Please refer to FIG. 11. Another interlayer dielectric layer 230 may be formed, covering the interlayer dielectric layer 220 and the metal gate structures 178 and 188. Contact plugs 410 and 420 may be formed and electrically connect with the source/drain regions 192 and the metal gate structure 188 respectively.

By applying the isolation structure and manufacturing process according to the present invention, a contentious fin structure may be divided into several isolated fin segments for the following process to form individual fin FETs thereon according to the layout design. The small width of the isolation structure may achieve a smaller layout area. Moreover, by covering the adjacent distal ends of the fin segments, the epitaxial bridging issue is prevented. Furthermore, the facet-defect formed during the epitaxial growing is also prevented, and the yield of the source/drain contact plugs is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a fin structure disposed on a substrate; and
   an isolation structure formed in the fin structure, comprising:
      a trench;
      a first dielectric layer disposed in the trench, comprising a body portion in the bottom, a protruding portion in the top with a top surface, and a shoulder portion connecting the body portion and the protruding portion, wherein the protruding portion has a smaller width than the body portion; and
      a second dielectric layer, covering a top corner of the trench and sandwiched in between the protruding portion and the shoulder portion of the first dielectric layer and an upper sidewall of the trench.

2. The semiconductor structure according to claim 1, further comprising an inter-fin isolation structure, encompassing the fin structure along a longitudinal direction of the fin structure, wherein the inter-fin isolation structure comprises an inter-fin trench and a dielectric layer filling the inter-fin trench.

3. The semiconductor structure according to claim 2, wherein the trench and the inter-fin trench have the same depth.

4. The semiconductor structure according to claim 1, wherein a seam is formed in the middle of the first dielectric layer and extending along the depth direction of the trench.

5. The semiconductor structure according to claim 4, wherein the first dielectric layer comprises silicon nitride.

6. The semiconductor structure according to claim 1, further comprising a liner disposed between the body portion and a lower sidewall of the trench, wherein the protruding portion is not in direct contact with the liner.

7. The semiconductor structure according to claim 6, wherein the second dielectric layer is thicker than the liner.

8. The semiconductor structure according to claim 1, wherein the top surface of the protruding portion is lower than the fin structure by 10 to 100 angstroms.

9. The semiconductor structure according to claim 1, further comprising a gate structure, comprising:
   a gate body, disposed on the fin structure, aligned with the trench and completely covering the trench;
   a spacer, disposed on two opposite sidewalls of the gate body; and
   a gate dielectric layer, disposed between the spacer and the fin structure.

10. The semiconductor structure according to claim 9, wherein the gate body fills an upper portion of the trench, and the second dielectric layer is sandwiched in between the gate body of the gate structure, the protruding portion and the shoulder portion of the first dielectric layer and the upper sidewall of the trench.

11. The semiconductor structure according to claim 10, wherein the gate body comprises a metal, and the second dielectric layer comprises an interfacial layer and a high-k dielectric layer.

12. The semiconductor structure according to claim 11, wherein the interfacial layer covers the top corner and the upper sidewall of the trench, and the high-k dielectric layer covers the interfacial layer and the top surface of the protruding portion of the first dielectric layer.

13. The semiconductor structure according to claim 9, further comprising a source/drain region, formed in the fin structure at each side of the gate structure and adjacent to the trench, wherein a bottom portion of the source/drain region is lower than the shoulder portion of the first dielectric layer.

14. A method of forming a semiconductor structure, comprising:
   providing a fin structure formed on a substrate;
   forming a trench in the fin structure;
   forming a first dielectric layer filling the trench, wherein the first dielectric layer comprises a body portion in the bottom, a protruding portion in the top and a shoulder portion connecting the body portion and the protruding portion; and
   forming a second dielectric layer, covering a top corner of the trench and sandwiched in between the protruding portion and the shoulder portion of the first dielectric layer and an upper sidewall of the trench.

15. The method of forming a semiconductor structure according to claim 14, further comprising forming an inter-fin isolation structure, encompassing the fin structure along a longitudinal direction of the fin structure.

16. The method of forming a semiconductor structure according to claim 14, wherein the first dielectric layer is formed by the atomic layer deposition (ALD) process.

17. The method of forming a semiconductor structure according to claim 16, wherein the first dielectric layer comprises silicon nitride.

18. The method of forming a semiconductor structure according to claim 14, further comprising forming a liner on a surface of the trench before forming the first dielectric layer.

19. The method of forming a semiconductor structure according to claim 14, further comprising forming a gate structure, wherein the gate structure comprises a gate body aligned with and completely covering the trench and filling into an upper portion of the trench, and the second dielectric layer is sandwiched in between the gate body of the gate structure, the protruding portion and the shoulder portion of the first dielectric layer and the upper sidewall of the trench.

20. The method of forming a semiconductor structure according to claim 19, further comprising forming a source/drain region in the fin structure at each side of the gate structure.

* * * * *